United States Patent [19]

Sugita

[11] 4,439,146

[45] Mar. 27, 1984

[54] HEAT TREATMENT APPARATUS

[75] Inventor: Kazuhiro Sugita, Yokohama, Japan

[73] Assignee: Sony Corporation, Tokyo, Japan

[21] Appl. No.: 426,734

[22] Filed: Sep. 29, 1982

[30] Foreign Application Priority Data

Jun. 14, 1982 [JP] Japan ................................. 57-101552

[51] Int. Cl.³ .......................... F27D 5/00; F27B 9/00
[52] U.S. Cl. ..................................... 432/253; 432/239;
432/5; 432/6; 414/152; 414/156; 118/500
[58] Field of Search ................... 432/239, 253, 152, 5,
432/6, 258; 118/500, 503; 414/152, 156

[56] References Cited
U.S. PATENT DOCUMENTS

| | | | |
|---|---|---|---|
| 3,183,130 | 5/1965 | Reynolds et al. | 432/253 |
| 3,669,431 | 6/1972 | Lenss et al. | 432/5 |
| 3,723,053 | 3/1973 | Myers et al. | 432/6 |
| 3,744,650 | 7/1973 | Henebry et al. | 832/239 |
| 3,771,948 | 11/1973 | Matsumiya | 432/239 |

Primary Examiner—Henry C. Yuen
Attorney, Agent, or Firm—Hill, Van Santen, Steadman & Simpson

[57] ABSTRACT

A heat treatment apparatus is disclosed, which includes a tube device having a tube axis in the horizontal direction for receiving therein an object to be treated so as to treat the same by heat, a holding member for holding thereon a plurality of objects to be treated, first and second supporting devices located at one end outside of the tube device, a first coupling member for coupling the first supporting device with the holding member, a first operating member for moving the holding member in the horizontal direction, a second coupling member attached to the second supporting device for holding a holding portion of the holding member by shaft-rotation, and a second operating member for moving the holding member in the horizontal and vertical directions.

1 Claim, 9 Drawing Figures

HEAT TREATMENT APPARATUS

BACKGROUND OF THE INVENTION

1. Field of the Invention

This invention relates generally to a heat treatment apparatus and more particularly relates to an improved heat treatment apparatus which is suitable for use with a semiconductor manufacturing apparatus.

2. Description of the Prior Art

In a manufacturing process of semiconductor elements there are generally treating processes employing a so-called horizontal heating furnace such as heat diffusion treatment, chemical vapor deposition (hereinafter, simply called as CVD) or annealing treatment. In these treating processes, it is desired that a series of work processes where semiconductor wafers are taken out from casettes, transported into heating furnaces under the state that the semiconductor wafers are arranged with a constant or predetermined interval, and after the treatments, returned into the original cassettes be automatized.

The work process using the prior art apparatus is as follows.

(i) Take out the semiconductor wafers from the cassette by a pair of tweezers;

(ii) Arrange these wafers on a boat with a predetermined pitch by the pair of tweezers;

(iii) Put this boat on a boat receiving base;

(iv) Holding this boat receiving base and carry the boat into a core tube of a furnace;

(v) Catch the boat by a boat insertion bar, operate a boat loader, and insert the boat into the central part of the core tube of the furnace;

(vi) Awaiting that temperature within the core tube of the furnace rises at the original degree because it was lowered by the insertion of the boat, inject gas thereinto and perform the treatments such as diffusion, CVD and so on for the semiconductor wafers; and (vii) After the treatments being finished, perform the above works in the reverse order of the above as in the order from (v) to (i) and introduce the wafers treated into the original cassette again.

Of these work processes, only the work processes from the boat loader work (v) to the main treatments within the heating furnace (vi) are automatized, but other work processes are all dependent on manual labor in the prior art.

Therefore, the inventor of this invention has previously proposed a semiconductor manufacturing apparatus, in which in the case of manufacturing semiconductor elements all treatment processes employing the horizontal heating furnaces can be automatized.

Now, such previously proposed semiconductor manufacturing apparatus will be described with reference to the drawings.

Figure 1:
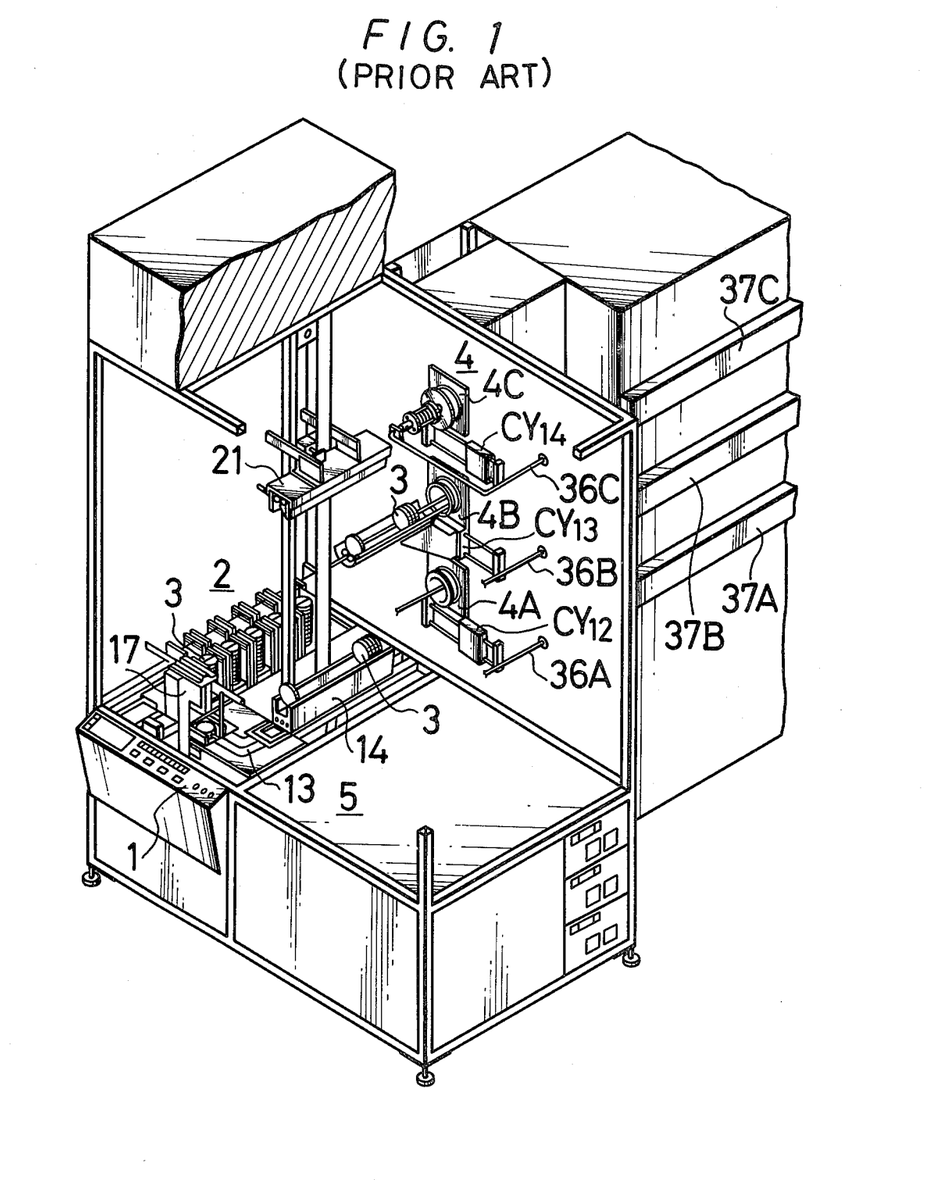
FIG. 1 is a perspective view illustrating an overall arrangement of a prior art semiconductor manufacturing apparatus.
Figure 2:
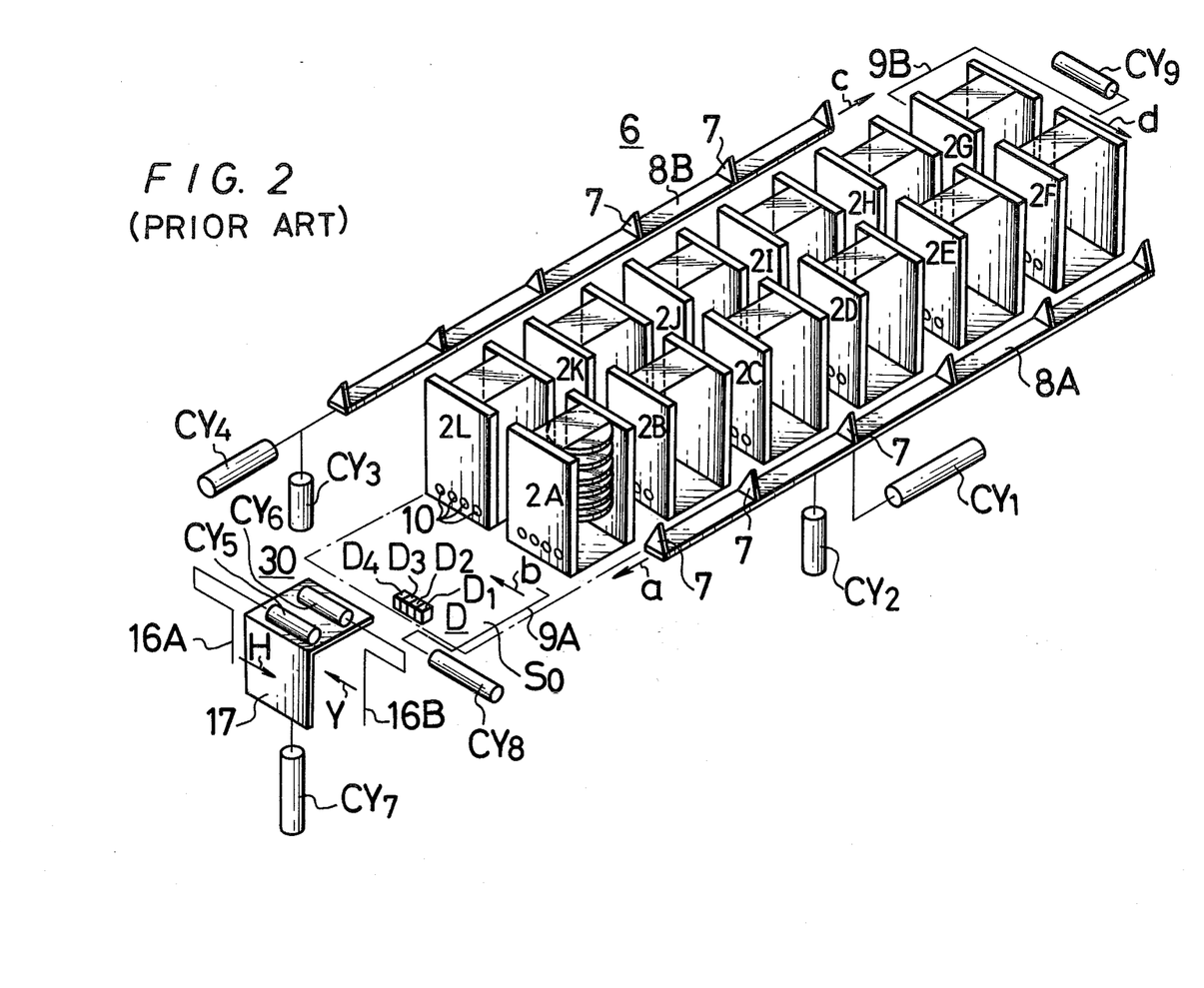
FIG. 2 is a schematic structural view of a cassette portion thereof.

FIG. 1 shows an overall arrangement of this semiconductor manufacturing apparatus, and this apparatus is arranged so that a series of work processes be automatically controlled by a microcomputer as follows. That is, a plurality of subjects to be treated or semiconductor wafers are taken out from receptacles (cassettes) which hold therein the same, arranged in line with a constant or predetermined space, inserted into a specified heating furnace in which the wafers undergo predetermined treatments (treatments such as diffusion, CVD, and annealing), and thereafter the wafers thus treated are again introduced into the original cassettes. As shown in the figures, this semiconductor manufacturing apparatus includes a control operation section 1 for automatically controlling the afore-described all work processes by the microcomputer, a plurality (twelve, in this example) of receptacles or cassettes 2 (2A, 2B . . . , 2L shown in FIG. 2) with code numbers attached thereon respectively for holding thereon plural semiconductor wafers 3, a treating apparatus 4 having three heating furnaces 4A, 4B and 4C arranged in, for example, the vertical direction, and a transporting apparatus 5 for transporting the wafers 3 between the cassettes 2 and the treating apparatus 4. Each cassette 2 is formed as a box-shape the one of the opposing sides of which are cut away, and into which semiconductor wafers 3 of one lot amount, for example, 25 are arranged with a predetermined pitch (pitch of, for example, 4.76 mm) in the vertical direction in the form of a laminate. As shown in FIG. 2, the plurality of cassettes 2 are arranged in two rows and transported one by one along the directions shown by arrows a, b, c and d intermittently and circularly. When the code number of each of the cassette 2 reaches a position $S_0$, the code number thereof is recognized by a photosensor D and then the cassette in question is selected. To this end, each cassette 2 has at its side surface with four through-holes 10 bored therethrough which the microcomputer can recognize, whereby the photosensor D comprised of reflection type light-emitting diodes $D_1$, $D_2$, $D_3$ and $D_4$ discriminates the portion of the surface of the cassette 2 where the light beam emitted from the photosensor D is reflected from the portion thereof where the light beam therefrom is not reflected thereby producing a hexadecimal signal of 4 bits thus the code number of each of the cassettes 2 being digitized. The portion of each of the surfaces of the cassettes 2 to reflect the light beam is made of metal surface as it is, while the portion which does not reflect the light beam is provided with a black rubber bonded thereon in which the infrared ray emitted from each of the light-emitting diodes $D_1$, $D_2$, $D_3$ and $D_4$ is not reflected.

A feeding mechanism 6 for circulating the cassettes 2 includes a pair of feeding nail members 8A and 8B located respectively beneath the two rows of the cassettes 2 and having nails 7 formed integrally thereon at the position corresponding to each of the spaces defined by the adjacent cassettes 2 and a pair of arms 9A and 9B correspondingly provided at both ends of the two rows. In this case, after the feeding nail member 8A was lifted up by a cylinder $CY_2$ and the respective nails 7 thereof were inserted into the spaces between the adjacent cassettes 2, the feeding nail member 8A is transported by a cylinder $CY_1$ by the amount of one cassette in the direction shown by the arrow a so that the cassettes 2A to 2F arranged on the one row are pushed by the respective nails 7, transported by the amount of one cassette in the direction a and the cassette 2A reaches the position $S_0$ thereby. Next, due to the movement of the arm 9A in the direction indicated by the arrow b done by a cylinder $CY_8$ the cassette 2A located at the position $S_0$ is transported to the other row, while due to the movement of the arm 9B in the direction indicated by the arrow d done by a cylinder $CY_9$ the cassette 2G is transported to the adjacent row. Since the feeding nail member 8B is lifted up by a cylinder $CY_3$ and moved by a cylinder $CY_4$ in the direction shown by the arrow c, the cassettes 2A, 2L . . . 2H on the other row are similarly transported by the amount of one cassette thus the respective cassettes 2 are transported circularly.

Figure 3:
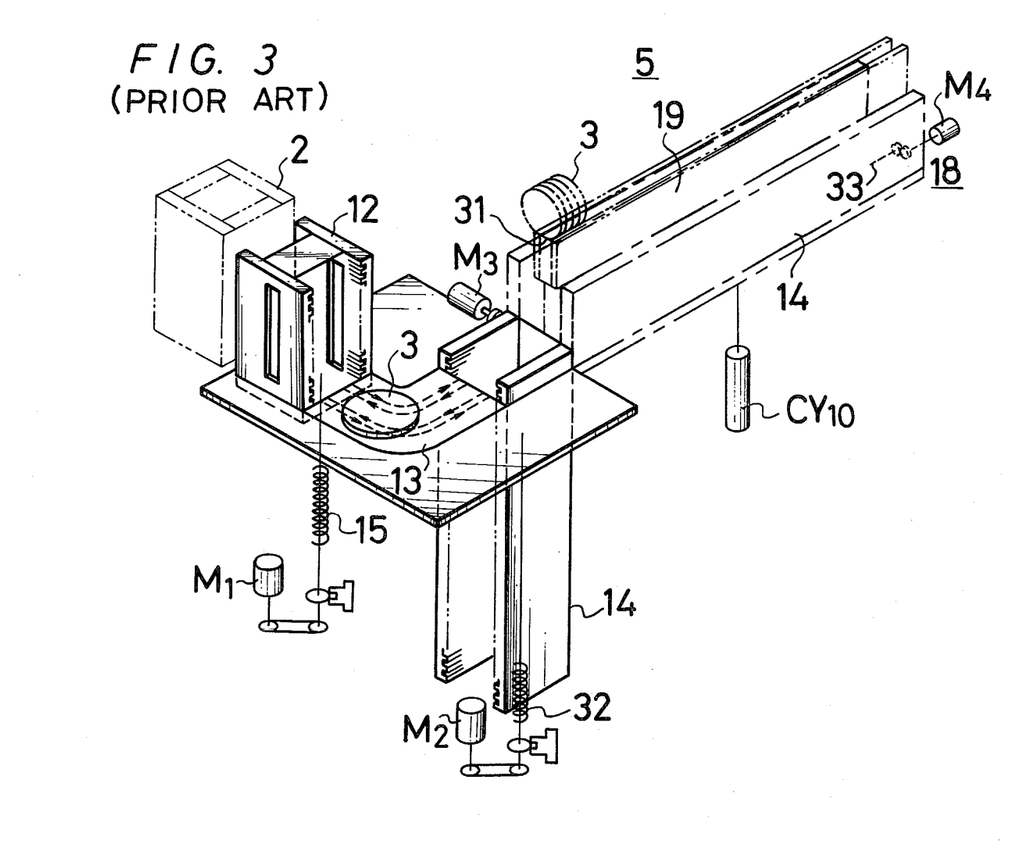
FIG. 3 is a schematic structural view of a main part of a transporting apparatus for wafers of the apparatus shown in FIG. 1.

On the other hand, as shown in FIG. 3, the transporting apparatus 5 includes a pitch converting small case 12 for taking out and holding therein the wafers 3 within the cassette 2 designated by the photosensor D with a pitch same as that of the cassette 2 once, an air bearing 13 to transport the wafers 3 sheet by sheet from this small case 12 and a pitch converting large case 14 arranging therein the wafers 3 thus transported in sequence with a predetermined pitch. The small case 12 is located at the position adjacent to and opposing to the cassette 2 brought to the position $S_0$ and arranged across the air bearing 13 to be movable at every one pitch in the vertical direction through a vertical moving means 15 including a pulse motor $M_1$. To transfer the wafers 3 between the designated cassette 2 at the position $S_0$ and the small case 12, over and above the cassette 2 and the small case 12 is provided a transporting mechanism 30; which is comprised of a supporting member 17 to be movable in the up and down direction by a cylinder $CY_7$ and a pair of arms 16A and 16B supported by this supporting member 17 and to be driven in the opposite directions with each other by cylinders $CY_5$ and $CY_6$. In accordance with the transporting mechanism 30, when the wafers 30 are taken out from, for example, the cassette 2 and held in the small case 12, the supporting member 17 is lowered by the cylinder $CY_7$ and thereafter the cylinder $CY_5$ is actuated to move the arm 16A in the direction shown by an arrow H. By this arm 16A, all 25 wafers within the cassette 2 are shifted into the small case 12 one at a time. The wafers 3 are transferred from the small case 12 to the cassette 2 by moving the arm 16B by the cylinder $CY_8$ in the direction shown by an arrow Y.

The pitch converting large case 14 is located at the other end of the air bearing 13 so as to oppose to the small case 12 and arranged thereacross to be movable by one pitch in the vertical direction through a vertical moving means 33 including a pulse motor $M_2$ and then rotated to be horizontal by a motor $M_3$ when it reaches the uppermost position. In this case, if a pitch at which the wafers 3 are held therein is set, for example, as 4.0 mm, the large case 14 keeps therein 100 (amounts of four cassettes) wafers 3; at 8.0 mm, 50 (amounts of two cassettes) wafers 3; and at 12.0 mm, 25 (amount of one cassette) wafers 3, respectively. The wafers 3 are transferred from the small case 12 to the large case 14 as follows; the small case 12 in which the wafers 3 are kept is lowered pitch by pitch to feed the laminated wafers 3 one by one through the air bearing 13 to the large case 14 from the bottom, while the large case 14 is lifted up pitch by pitch in synchronism with the lowering of the small case 12 to take therein the wafers 3 one by one from the top of the large case 14. The transfer of the wafers 3 from the large case 14 to the small case 12 is vice versa, in which the small case 12 is lifted up pitch by pitch from the underside, while the large case 14 is lowered pitch by pitch. In the state under which the wafers 3 have been transferred into the large case 14 completely, each of facets 31 (a portion where part of the wafer 3 is cut away horizontally for ensuring the positioning) of the respective wafers 3 is not located regularly. Therefore the large case 14 is provided at its underside with means 18 for arranging the facets 31 of the respective wafers 3 in line. This means 18 is comprised of a rod-shaped rotatable member 33 which rotatably comes into contact with, for example, the periphery of each of the wafers 3 commonly by a motor $M_4$. When the respective wafers 3 are rotated by this rod-shaped rotatable member 33, the wafers 3 are detached at their facets 31 from the rod-shaped rotatable member 33, and the rotation of the wafers 3 is terminated whereby the facets 31 of the respective wafers 3 are arranged in line. Moreover, the large case 14 is provided at its underside with a wafer lift 19 which permits all the wafers 3 to be lifted upwardly from the large case 14. Reference $CY_{10}$ denotes a cylinder for vertically moving the wafer lift 19.

Figure 4:
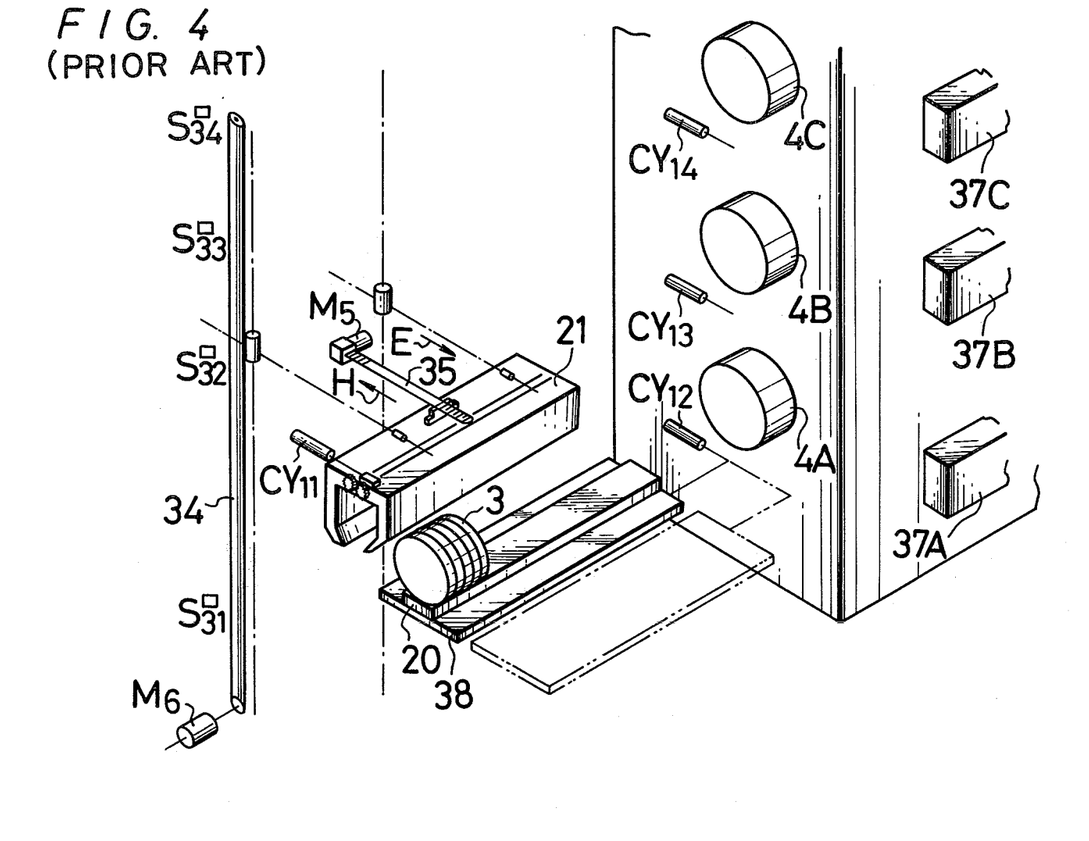
FIG. 4 is a schematic structural view of other main parts of the prior art semiconductor manufacturing apparatus.

As shown in FIG. 4, the transporting apparatus 5 further includes a wafer chuck 21 for holding all the wafers 3 kept in the large case 14 and transporting them onto boats 20 of the designated heating furnace 4 (4A, 4B, or 4C). This chuck 21 is arranged movable in the vertical direction by way of a vertical moving means (for example, a feeding screw mechanism and the like) 34 including a pulse motor $M_6$ and also movable in the horizontal direction by way of a horizontal moving means 35 including a motor $M_5$. Reference $CY_{11}$ designates a cylinder which permits the wafer chuck 21 to open and/or close. In the treating apparatus 4 with three heating furnaces 4A, 4B and 4C, three boats 20 are prepared to correspond to the respective heating furnaces 4A, 4B and 4C. As shown in FIG. 1, these boats 20 are respectively connected with boat loader arms 36A, 36B and 36C and then entered into or got out from the heating furnaces 4A, 4B and 4C by boat loaders 37A, 37B and 37C. In the proximity of the external entrances of the respective heating furnaces 4A, 4B and 4C are respectively provided receiving or holding bases 38 for respectively holding the boats 20. When the boats 20 are inserted into the heating furnaces 4A, 4B and 4C, the receiving bases 38 are laterally moved and then put into the standby state by corresponding cylinders $CY_{12}$, $CY_{13}$ and $CY_{14}$.

Next, the operation of the arrangement made so far will be described.

When a plurality of, in this example, 12 cassettes 2, each keeping therein one lot amount of semiconductor wafers 3 of, for example, 25 ones are transported to the predetermined position as illustrated in FIG. 1, thereafter they are controlled by the microcomputer. First, twelve cassettes 2 are transported one by one by the cassette transporting mechanism 6 intermittently and circularly. When the first cassette 2A is transported to the position $S_0$, the code number of the cassette 2A is ascertained by the photosensor D. If this cassette 2A is the designated cassette, as shown in FIG. 2, the supporting member 17 is lowered by the cylinder $CY_7$, the arm 16A is opposed to the cut out side of the cassette 2A and then, the arm 16A is moved by the cylinder $CY_5$ in the direction shown by the arrow H so as to pass through the cassette 2A thus 25 wafers 3 therein are all transferred from the cassette 2A to the pitch converting small case 12 shown in FIG. 3. Next, the air bearing 13 is actuated to transport the lowermost wafer 3 opposing thereto on the air bearing 13 and it is held in the uppermost portion of the pitch converting large case 14. Thereafter, the small case 12 is lowered at every pitch to supply from the underside the wafer 3 one by one through the air bearing 13 into the large case 14, which is lifted up pitch by pitch, at the pitch of, for example, 4 mm pitch (pitch at which the wafer 3 is kept into the large case 14 can be freely selected by previously designating the pitch at which the large case 14 is lifted intermittently, to be 4 mm pitch, 8 mm pitch, 12 mm pitch and so on).

Figures 5, 6:
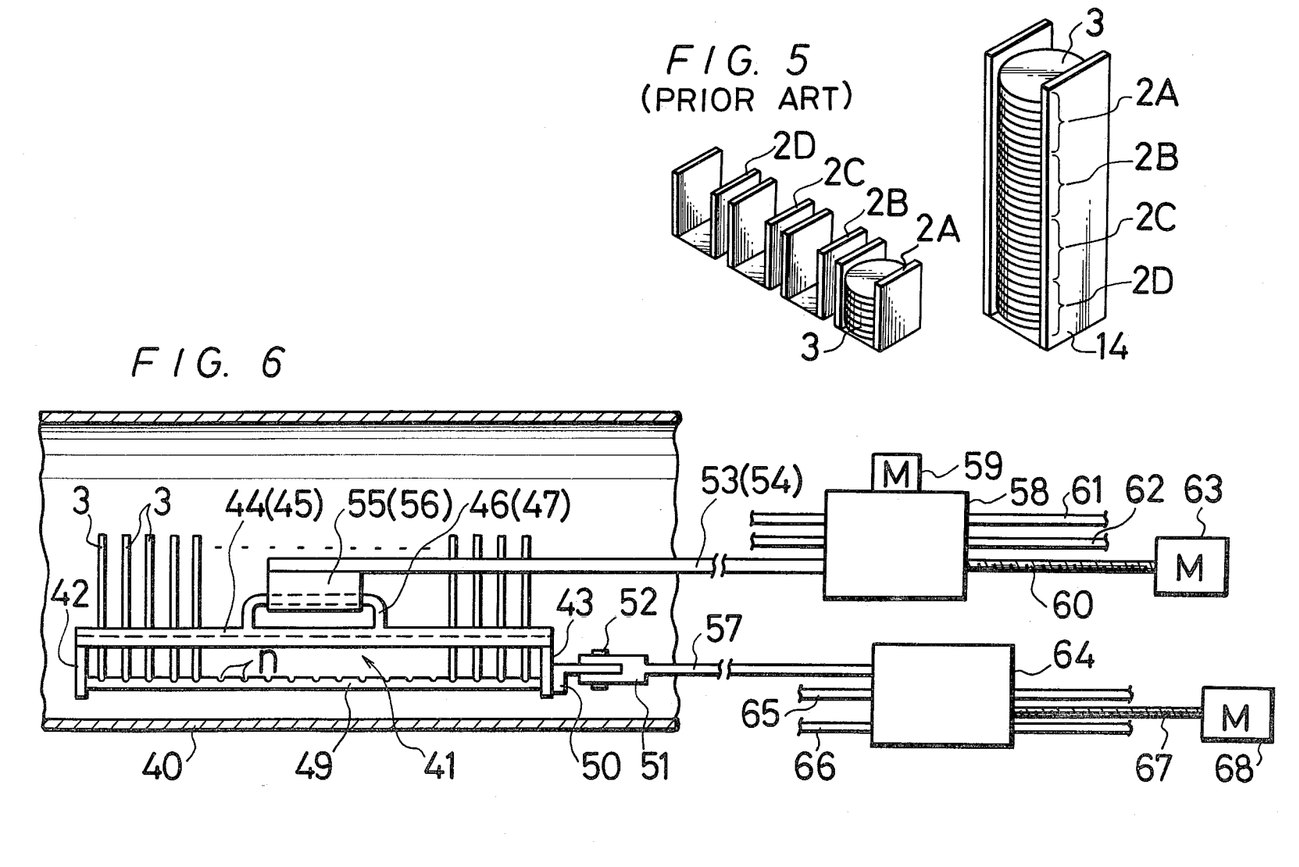
FIG. 5 is a schematic view useful for explaining the operation thereof.
FIG. 6 is a side view illustrating partially in cross-section an embodiment of a heat treatment apparatus according to this invention.

After the holding of the wafers 3 of one cassette amount was finished, in like manner the wafers 3 of the second, third, and fourth cassettes 2B, 2C and 2D are transported into the large case 14 from the following stage so that totally 100 wafers 3 of four cassettes 2A to 2D are held into the large case 14 as shown in FIG. 5. After all the wafers 3 of the designated cassettes 2 are kept into the large case 14, the large case 14 is rotated to be horizontal by driving the motor $M_3$ as shown by a one-dot chain line in FIG. 3. Subsequently, the rod-shaped rotatable member 33 is rotated by the motor $M_4$ and the facets 31 of the respective wafers 3 are arranged in line thereby. Thereafter the wafer lift 19 is lifted up by the cylinder $CY_{10}$ thereby lifting all the wafers 3 kept within the large case 14. Next, the wafer chuck 21 on standby at a position $S_{34}$ in FIG. 4 is lowered by the vertical transporting means 34 to a position $S_{31}$ and grasp all the wafers 3 on the wafer lift 19 by actuating the cylinder $CY_{11}$. Thereafter, the wafer chuck 21 is lifted up to the position corresponding to the height of the designated heating furnace (core tube of the furnace), for example, the first heating furnace 4A and, then moved horizontally in the direction shown by an arrow E by way of the horizontal transporting means 35 thus the wafers 3 being put on the boat 20 of the designated heating furnace 4A. At this time, the boat 20 is held on the receiving base 38. After having put the wafers 3 on the boat 20, the wafer chuck 21 is horizontally moved in the direction shown by the arrow H, comes back to the predetermined position $S_{34}$ in the vertical direction, and then put into the standby state. After the wafers 3 were put on the boat 20, this boat 20 is inserted into the heating furnace 4A by way of the boat loader arm 36A and the boat loader 37A. In this way, the semiconductor wafers 3 of four cassettes each are respectively inserted into the designated heating furnaces 4B and 4C, in which they will undergo the predetermined treatments such as diffusion, CVD and annealing.

After the treatments, the boats 20 with the wafers 3 put thereon are respectively taken out from the heating furnaces 4A, 4B and 4C each, and thereafter in the perfectly reverse order of the operation upon insertion of the wafers 3, the respective wafers 3 are held into the designated initial cassettes 2. Speaking concretely, first the wafer chuck 21 is operated to grasp the wafers 3 treated in the heating furnace 4C and put them on the wafer lift 19 within the pitch converting large case 14. Then the wafer lift 19 is lowered by the cylinder $CY_{10}$ and the wafers 3 are kept into the large case 14 thereby. Thereafter, the wafer chuck 21 is returned to the initial position $S_{34}$. The large case 14 are erected by the motor $M_3$ so as to face the air bearing 13 and the wafers 3 kept within the large case 14 is transported one by one by the subsequent operation of the air bearing 13 to be kept into the small case 12. At this time, the large case 14 is lowered by one pitch each, while the small case 12 is concurrently lifted by one pitch each. Whereas, at the side of the cassettes 2, the cassettes 2 are transported by the cassette transporting mechanism 6 and the code numbers thereof are identified by the photosensor D, whereby the designated cassette, in this case, the cassette 2L is selected and then put into the standby state at the position $S_0$. After 25 wafers 3 of one cassette amount (that is the amount to be kept into the cassette 2L) were kept into the small case 12, the cylinder $CY_7$ is actuated to lower the supporting member 17 and then the arm 16B is moved by the cylinder $CY_6$ in the direction shown by the arrow Y in FIG. 2 thus all the wafers 3 within the small case 12 being transferred into the originally designated cassette 2L to be held therein. In like manner, the next 25 wafers 3 within the large case 14 are put into the cassette 2K and the corresponding wafers 3 are sequentially put into the cassettes 2J and 2I. After the keeping of the wafers 3 in the heating furnace 4C, the same operations as described above are repeated and the wafers 3 in the second heating furnace 4B and the wafers 3 in the first heating furnace 4A are respectively put into the corresponding original cassettes 2.

According to the afore-mentioned semiconductor manufacturing apparatus, in the case of manufacturing the semiconductor elements, all works in the treating processes such as diffusion CVD, annealing and so on using the horizontal heating furnaces, or a series of work processes where the semiconductor wafers are taken out from the cassettes, transported to the heating furnaces under the state that the semiconductor wafers are arranged in line with the constant space or distance, and after the completion of their treatments, they are returned to the original and designated cassettes are carried out automatically. Thus, such advantages are brought about that no-man operation of the apparatus becomes possible, for example, all night long the rate of operation of the apparatus is improved and the number of workers is reduced and so on.

By the way, in such prior art semiconductor manufacturing apparatus, in order to insert the boats 20 with the wafers 3 put thereon into the core tubes or heating furnaces 4A, 4B and 4C or take them out therefrom, the boats 20 are slid on the inner surfaces of the core tubes.

For this reason, impurities adhered to the inner surfaces of the core tubes are flown up and the wafers are contaminated thereby. This leads to the lowering of the yield of the semiconductor elements.

OBJECTS AND SUMMARY OF THE INVENTION

Accordingly, an object of the present invention is to provide a heat treatment apparatus which can obviate the afore-said defects inherent in a conventional apparatus.

Another object of the present invention is to provide a heat treatment apparatus which is particularly suitable for use with a semiconductor manufacturing apparatus.

Further object of the present invention is to provide a heat treatment apparatus, in which a carrying member such as a boat or the like where objects to be treated such as wafers are held can be inserted into and/or extracted from a tube apparatus such as a core tube of a furnace without being contact with the inner surface thereof.

Still further object of the present invention is to provide a heat treatment apparatus which can effectively avoid the lowering of the yield of the treated objects such as the wafers.

According to an aspect of the present invention, there is provided a heat treatment apparatus comprising:
a tube means having a tube axis in the horizontal direction for receiving therein an object to be treated so as to treat the same by heat;
a holding member means for holding thereon a plurality of objects to be treated;

first and second supporting means located at one end outside of said tube means;

a first coupling means for coupling said first supporting means with said holding means;

a first operating means for moving said holding means in the horizontal direction;

a second coupling means attached to said second supporting means for holding a holding portion of said holding means by shaft-rotation; and a second operating means for moving said holding means in the horizontal and vertical directions.

The above, and other objects, features and advantages of the present invention will become readily apparent from the following detailed description of the illustrative embodiment of the invention which is to be read in connection with the accompanying drawings.

DESCRIPTION OF THE PREFERRED EMBODIMENT

Figures 7, 8, 9:
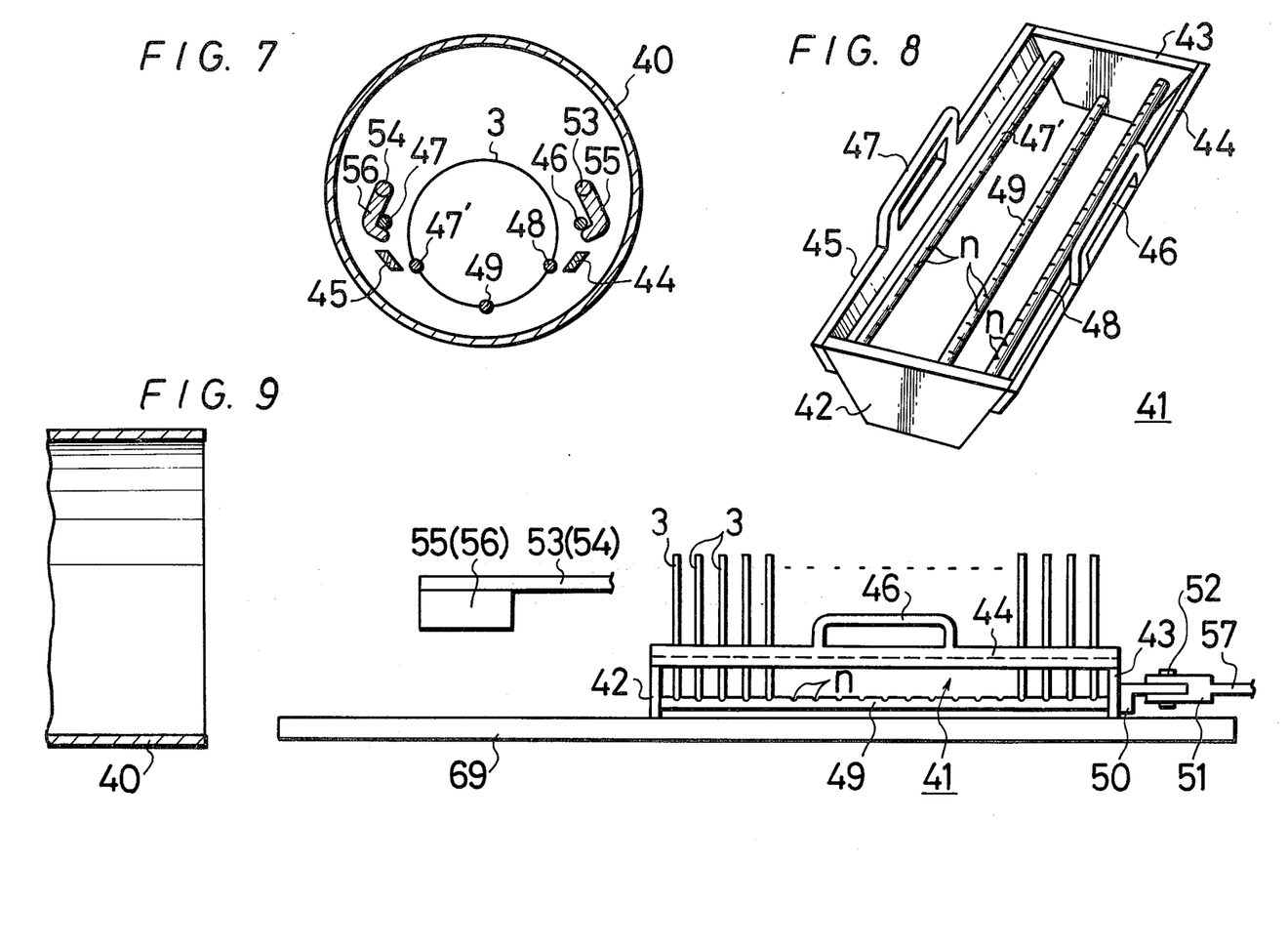
FIG. 7 is a cross-sectional view thereof.
FIG. 8 is a perspective view illustrating a structure of a boat used therein.
FIG. 9 is a side view illustrating the operation state of the embodiment of the heat treatment apparatus according to this invention.

Hereinafter, with reference to FIGS. 6 to 8, one embodiment of a heat treatment apparatus according to the present invention will be described. The heat treatment apparatus of this invention is applied to the semiconductor manufacturing apparatus such as described above. In FIG. 6, reference numeral 40 denotes a core tube of a furnace made of quartz and disposed in the horizontal direction, and numeral 41 denotes a boat made of quartz which carries a number of wafers 3 thereon.

First, this boat 41 will be discussed. Numerals 42 and 43 designate end plates each formed as in an inverse-trapezoidal shape, and these end plates 42 and 43 are connected by lateral plates 44 and 45 which have C-shaped handles or knobs 46 and 47 respectively thereby constructing a frame, of which the plane is rectangular as shown in FIG. 8. Between the end plates 42 and 43 are stretched three wafer supporting bars 47', 48 and 49 to be fixed, each being located at the top of an isosceles triangle. These wafer supporting bars 47', 48 and 49 are provided with a number of notches n cut out thereon at an equal distance for supporting and positioning the wafers 3. In FIG. 6, numeral 50 denotes a coupling portion which is fixed to the end plate 43 and coupled to a coupling portion 51 of an inserting and extracting shaft 57, which will be described later, by way of a pin 52. These coupling portions 50 and 51 can be released from the coupling state by extracting the pin 52.

Numerals 55 and 56 denote nails respectively attached to end portions of parallel rotary shafts 53 and 54 (made of stainless steel). These nails 55 and 56 can be rotated in opposite directions by the parallel rotary shafts 53 and 54. While these nails 55 and 56 are respectively rotated, they are engaged with the handles 46 and 47 to lift the boat 41 up. The rotary shafts 53 and 54 are both attached to a supporting base 58 and driven by a motor 59 in opposite directions. This supporting base 58 is guided by guide rails 61 and 62 and moved by a feeding screw 60 which is driven by a motor 63.

Numeral 57 designates the inserting and extracting shaft (made of quartz) for inserting or extracting the boat 41 into and/or from the core tube 40. This inserting and extracting shaft 57 is attached to a supporting base 64, and the supporting base 64 is guided by guide rails 65 and 66 and moved by a feeding screw 67 which is driven by a motor 68.

Next, referring to FIG. 9 too, the operation of the heat treatment apparatus constructed as above will be described. As illustrated in FIG. 9, first the boat 41 is in the outside of the core tube 40 and put on a receiving base 69. The wafers 3 are arranged on the boat 41 similarly to the aforesaid semiconductor manufacturing apparatus. The boat 41 is moved to the position of the nail 55 (56) in FIG. 9 by the rotation of the motor 68. Then, the motor 59 is rotated and hence the rotary shafts 53 and 54 are rotated so that the nails 55 and 56 engage with the handles 46 and 47 of the boat 41 as shown in FIG. 7 and then the boat 41 is somewhat lifted up (about 2 to 3 mm) from the receiving base 69. Next, by the synchronous rotation of the motor 63 with the motor 68, while the boat 41 is lifted by the nails 55 and 56, the boat 41 is pushed forward by the inserting and extracting shaft 57 and then inserted into the predetermined position within the core tube 40 in such a manner that the boat 41 will not contact with the inner surface of the core tube 40. Then, the rotary shafts 53 and 54 are rotated in the directions opposite to the previous directions to release the nails 55 and 56 from the handles 46 and 47 of the boat 41 and the boat 41 is slowly located on the inside of the core tube 40 thereby. Next, the motor 63 is driven to extract the nails 55 and 56 from the core tube 40 outside. The wafers 3 put on the boat 41 undergo the diffusion treatment at the temperature of about 1100° to 1200° C.

After this diffusion treatment, the nails 55 and 56 are inserted again into the core tube 40 and engaged with the handles 46 and 47 of the boat 41 thereby lifting the boat 41 somewhat. Next, by rotating the motors 63 and 68 in synchronism with each other, under the state that the boat 41 is lifted up by the nails 55 and 56, the boat 41 is pulled by the inserting and extracting shaft 57 and moved to the position of the receiving base 69 outside of the core tube 40 so as not to come into contact with the inner surface of the core tube 40. The rotary shafts 53 and 54 are rotated in the direction opposite to the above to permit the nails 55 and 56 to be released from the handles 46 and 47 of the boat 41 thus the boat 41 is put on the receiving base 69 still. Next, the boat 41 is further pulled out and reached to the position on the receiving base 69 shown in FIG. 9. Finally, in similar manner to the afore-said semiconductor manufacturing apparatus the wafers 3 are taken out from the boat 41.

In accordance with the heat treatment apparatus of the present invention described above, the supporting member (boat) which carries thereon the treated objects (wafers) can be inserted into or extracted from the tube apparatus (core tube) without being in contact with the inner surface thereof. Thus it is effectively avoided that the treated objects (wafers) are contaminated or polluted and the yield is lowered thereby. Therefore, the heat treatment apparatus according to this invention is particularly suitable for use with the semiconductor manufacturing apparatus discussed in the beginning.

The above description is given mainly on a single preferred embodiment of the invention, but it will be apparent that many modifications and variations could be effected by one skilled in the art without departing from the spirits or scope of the novel concepts of the invention, so that the scope of the invention should be determined by the appended claim only.

I claim as my invention:
1. A heat treatment apparatus comprising:
a tube having its axis in the horizontal direction for containing objects to be treated by heat;
a holder of a plurality of objects;
first and second supporting means located outside said tube;
means for connecting said first supporting means and said holder;
a first operating means for moving said holder in the horizontal direction;
means attached to said second supporting means for grasping a grip means of said holder by the rotation along its axis; and
a second operating means for moving said holder in the horizontal and vertical directions.

* * * * *